United States Patent [19]

Elco et al.

[11] Patent Number: 4,690,472
[45] Date of Patent: Sep. 1, 1987

[54] HIGH DENSITY FLEX CONNECTOR SYSTEM

[75] Inventors: Richard A. Elco, Mechanicsburg, Pa.; Hugh R. Vandegriff, Wilmington, Del.

[73] Assignee: E. I. Du Pont de Nemours and Company, Wilmington, Del.

[21] Appl. No.: 911,679

[22] Filed: Sep. 26, 1986

[51] Int. Cl.⁴ .............................................. H01R 9/09
[52] U.S. Cl. .................................... 439/67; 439/493; 439/499
[58] Field of Search ............ 339/17 F, 176 MF, 75 R, 339/75 M, 75 MP; 174/117 FF, 68.5; 428/901

[56]  References Cited
U.S. PATENT DOCUMENTS

| | | | |
|---|---|---|---|
| 3,090,028 | 5/1963 | Hall et al. | 339/17 F |
| 4,466,184 | 8/1984 | Cuned et al. | 339/17 F |
| 4,538,865 | 9/1985 | Wakabayashi et al. | 339/17 F |
| 4,583,800 | 4/1986 | Roberts et al. | 339/17 F |
| 4,602,317 | 7/1986 | Rovnyak et al. | 339/17 F |

Primary Examiner—John McQuade

[57]  ABSTRACT

Photodefined pin and guide arrangements on a connector and a printed wiring board are used to obtain an alignment between the connector and the printed wiring board. A clamp fixed to the connector housing squeezes the connector contact fingers to the connector pads of the board to engage pads and fingers which have been guided into an overlapping position by the guide and pin arrangement.

4 Claims, 6 Drawing Figures

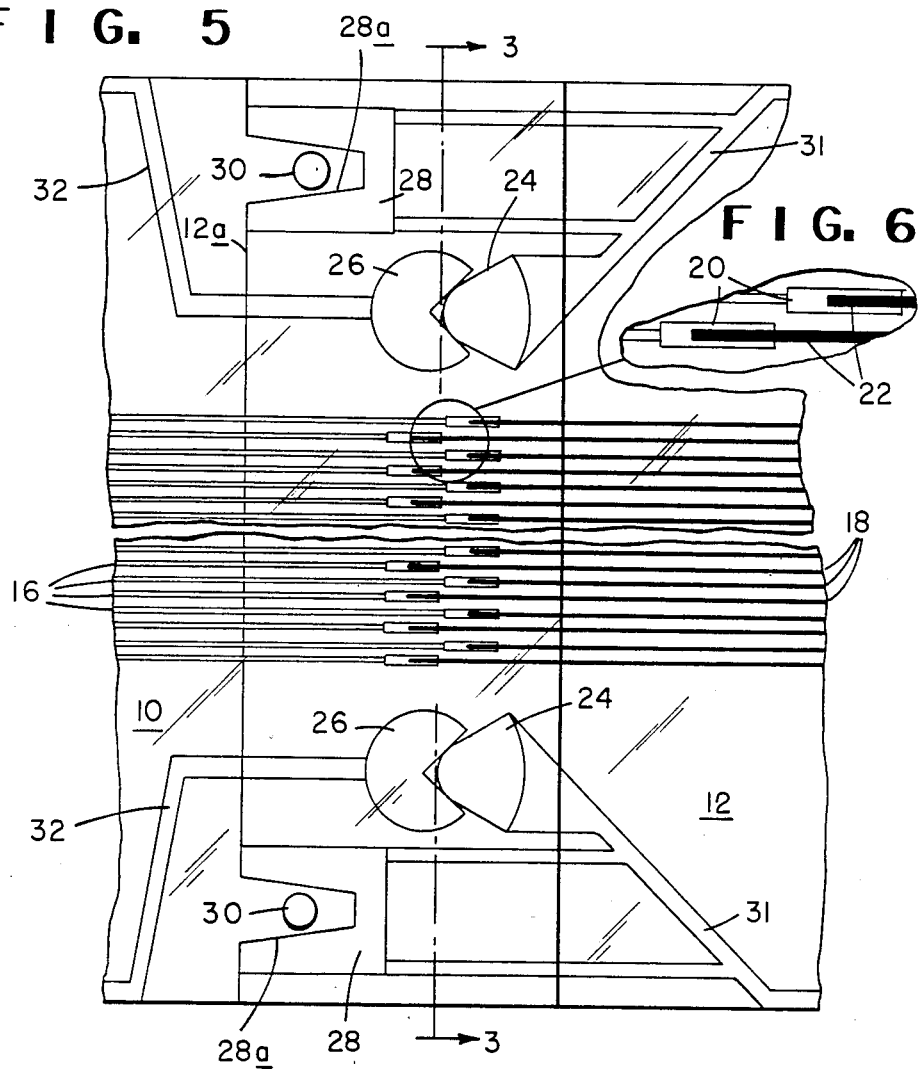
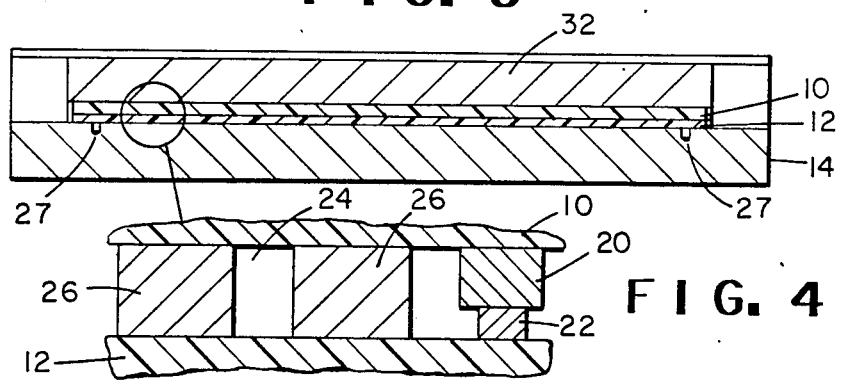

HIGH DENSITY FLEX CONNECTOR SYSTEM

BACKGROUND OF THE INVENTION

This invention is directed to the alignment of a connector to a printed wiring board (PWB).

The preparation and alignment of connectors to a PWB has been generally carried out by a complex, exacting process using the PWB edges for positioning the connector fingers relative to the PWB contact pads. The known positioning systems are not capable of positioning connector on centers of much less than 50 mils. A system has been developed for reducing the complexity and increasing the reliability of the alignment of such connections.

SUMMARY OF THE INVENTION

This invention provides a high density flex connector system capable of accurate alignment of the connector fingers with pads of a printed wiring board. The means for alignment includes a photodefined first guide located at each side of an array of pads located at the ends of traces of a printed wiring board and a photodefined second guide located at each side of an array of connector fingers at the ends of traces on a flex connector. The first and second guides intermesh as connector fingers are guided into an overlapping position with the pads to precisely align the fingers with pads. Similarly, meshing guides located slightly ahead of said first and second guides and with greater longitudinal and lateral travel during meshing than the first and second guides to provide a coarse alignment prior to meshing of the first and second guides.

BRIEF DESCRIPTION OF THE DRAWINGS

FIG. 3 is a sectioned view of FIG. 1 taken along line 3—3.

FIG. 4 is an enlarged view of a portion of FIG. 3.

FIG. 5 is an enlarged partial plan view of the overlap connection between the PWB and the flex connector.

FIG. 6 is an enlarged partial view of FIG. 5.

DETAILED DESCRIPTION OF THE PREFERRED EMBODIMENT

Figure 1:
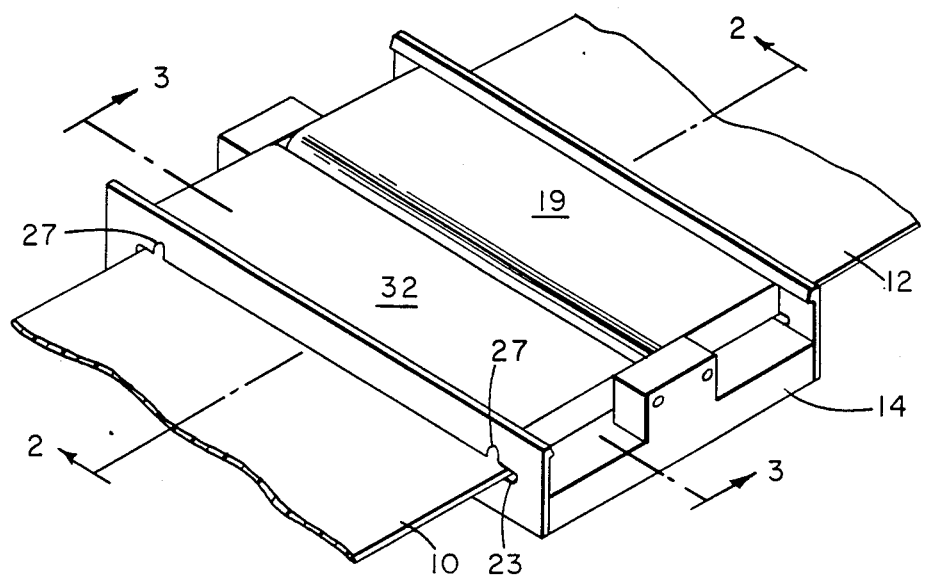
FIG. 1 is a perspective view of a connection system that utilizes the invention.
Figure 2:
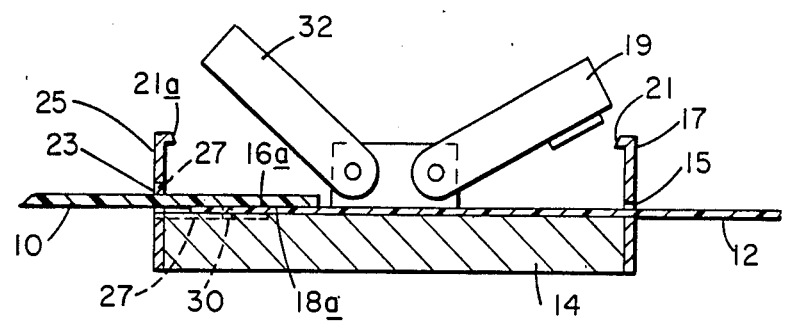
FIG. 2 is a sectioned view of FIG. 1 taken along line 2—2.

Referring now to FIG. 1, the embodiment chosen for purposes of illustration includes a printed wiring board 10 and a flex connector 12 joined together in an overlapping relationship within clamping connector housing 14. The overlapping relationship is best shown in FIGS. 2, 5 and 6 wherein PWB 10 and flex connector 12 have photodefined traces 16, 18 respectively applied to opposed surfaces 16a, 18a in a manner well known in the art. The traces 16 terminate in an array of connector pads 20 while the traces 18 terminate in an array of fingers 22. The means for aligning the PWB with the flex connector includes guide arrangements attached both to the PWB and the flex connector. More particularly, referring to FIG. 5 vee-shaped first guides 26 are located at each side of the array of connector pads 20 on PWB 10 and wedged-shaped second guides 24 are located at each side of the array of fingers 22 of the flex connector 12. The guides 24, 26 are photodefined at the time the traces, pads and fingers are photodefined, i.e., all in one operation. In addition to guides 24, 26 slotted third guides 28 are located at each side of the array of fingers 22 on the flex connector 12 at its leading edge 12a. These guides 28 have a slot 28a in them to accept an alignment pin 30 mounted at each side of the array of pads 20 on PWB 10. The guides 28 are photodefined on connector 12 while pins 30 are made of steel and are inserted in holes on PWB 10. Guides 28 and pins 30 form a coarse alignment arrangement to bring guides 24, 26 to approximate alignment before they mesh to provide precise alignment of the fingers 22 with the pads 20. Since the pads and fingers overlap, the guides 24, 26 are plated to a thickness of the overlap so they will engage as the PWB overlap the flex connector in housing 14. Electrical traces 31,32 located on flex connector 12 and PWB 10 respectively provide an electrical path to the edges of the flex connector and PWB to enable electroplating up of the guides 24,26,28. In addition these traces provide vertical positioning of the flex connector relative to the PWB during the joining process so that the fingers 22 properly overlap the pads 20.

The housing 14 is used to squeeze PWB 10 and flex connector 12 together to make contact between pads 20 and fingers 22. Flexible connector 12 enters housing 14 through a slot 15 in end wall 17 of the housing and is clamped in place by pivoting lever 19 which locks in place under a lip 21 of wall 17. The PWB enters housing 14 through a slot 23 in end wall 25 of the housing. Slot 23 has enlargements 27 to allow pins 30 on PWB 10 to pass through. When the PWB is in position overlapping connector 12 as shown with surfaces 16a, 18a facing each other, a pivoting lever 32 squeezes them together to make contact between the pads 20 and fingers 22. The lever locks in place under a lip 21a of wall 25.

Since the alignment guides 24, 26 and the traces with fingers and pads on the connector and PWB are photodefined in one operation, an absolute positioning reference system is established which permits positioning of connector pads on much closer centers on the PWB than previously possible.

We claim:

1. In a system for connecting a photodefined array of connector pads on a printed wiring board with a matching array of photodefined connector contact fingers and squeezing the connector into contact with the printed wiring board that includes a squeeze clamp for the connector and the printed wiring board, means for aligning said connector fingers as the connector fingers are guided into an overlapping position with said pads within said clamp comprising: a photodefined first guide located at each side of the array of connector pads; and a photodefined second guide located at each side of the array of fingers, said first and second guides intermeshing as said connector fingers are guided into said overlapping position to precisely align said fingers with said pads.

2. The system of claim 1 wherein said first guides are shaped like a vee-block and said second guides are shaped like a wedge to fit together with the vee-block.

3. The system of claim 1, including a third slotted guide located at the leading edge of the connector at each side of the array of fingers and a pin mounted on said printed wiring board on each side of the array of said pads, said pins engaging said slotted guides to approximately align said first and second guides.

4. The system of claim 3 wherein said third guide is photodefined on said connector.

* * * * *